(12) United States Patent
Kawamura

(10) Patent No.: US 7,220,521 B2
(45) Date of Patent: May 22, 2007

(54) FABRICATION METHOD OF SEMICONDUCTOR DEVICE

(75) Inventor: Eiichi Kawamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 287 days.

(21) Appl. No.: 11/063,750

(22) Filed: Feb. 24, 2005

(65) Prior Publication Data

US 2006/0028645 A1   Feb. 9, 2006

(30) Foreign Application Priority Data

Aug. 6, 2004   (JP) ............................ 2004-230834
Dec. 27, 2004  (JP) ............................ 2004-377038

(51) Int. Cl.
*G03F 9/00*     (2006.01)
(52) U.S. Cl. .......................................... 430/22; 430/30
(58) Field of Classification Search ................. 430/22, 430/30
See application file for complete search history.

(56) References Cited

FOREIGN PATENT DOCUMENTS

| JP | 2002-064046 | 2/2002 |
|---|---|---|
| JP | 2002-231596 | 8/2002 |
| JP | 2004-071622 | 3/2004 |

*Primary Examiner*—Christopher G. Young
(74) *Attorney, Agent, or Firm*—Westerman, Hattori, Daniels & Adrian, LLP.

(57) ABSTRACT

A method of fabricating a semiconductor device includes an exposing process in which a lower pattern is formed by a first exposing process and an upper pattern is formed thereon by a second exposing process, wherein the exposure process includes the steps of obtaining a first correction value representing a difference of first and second alignment error correction parameter preset values respectively used at the time of a first exposing process of exposing the lower patterns in a current lot and in a just-before lot, obtaining, as a second correction value, an optimum correction amount of a third alignment error correction parameter preset value needed for proper alignment of the upper pattern in the second exposing process of the just-before lot, the third alignment error correction parameter has been used in the second exposing process of the just-before lot for exposing the upper pattern, and obtaining an optimum correction parameter prediction value to be used for exposing the upper pattern in the second exposing process of the current lot, from the first correction value and the second correction value.

11 Claims, 11 Drawing Sheets

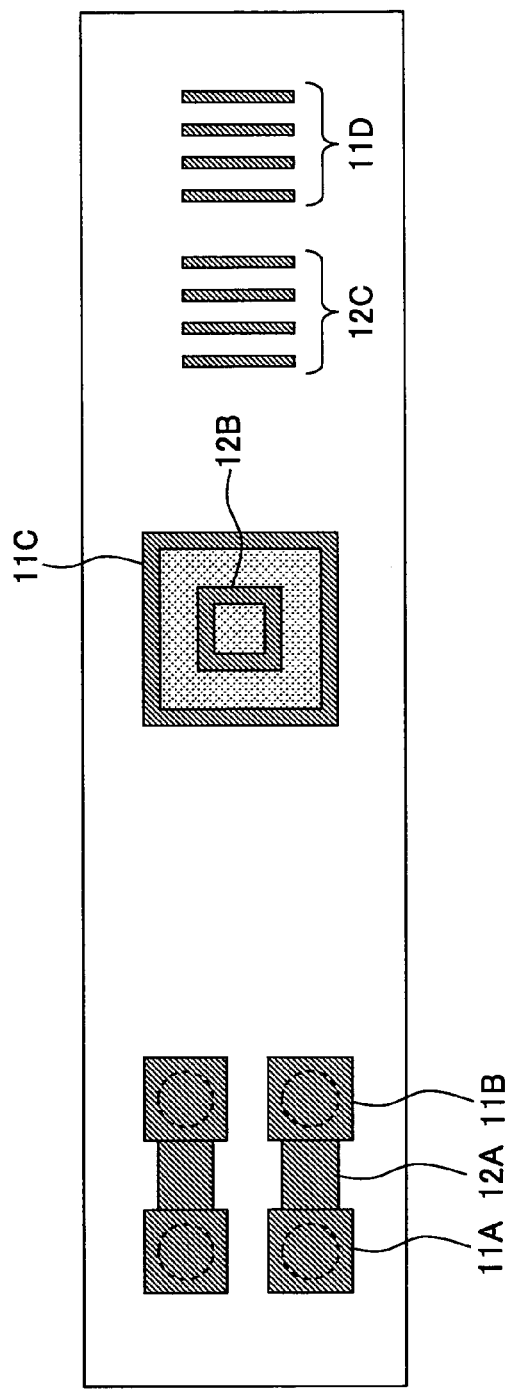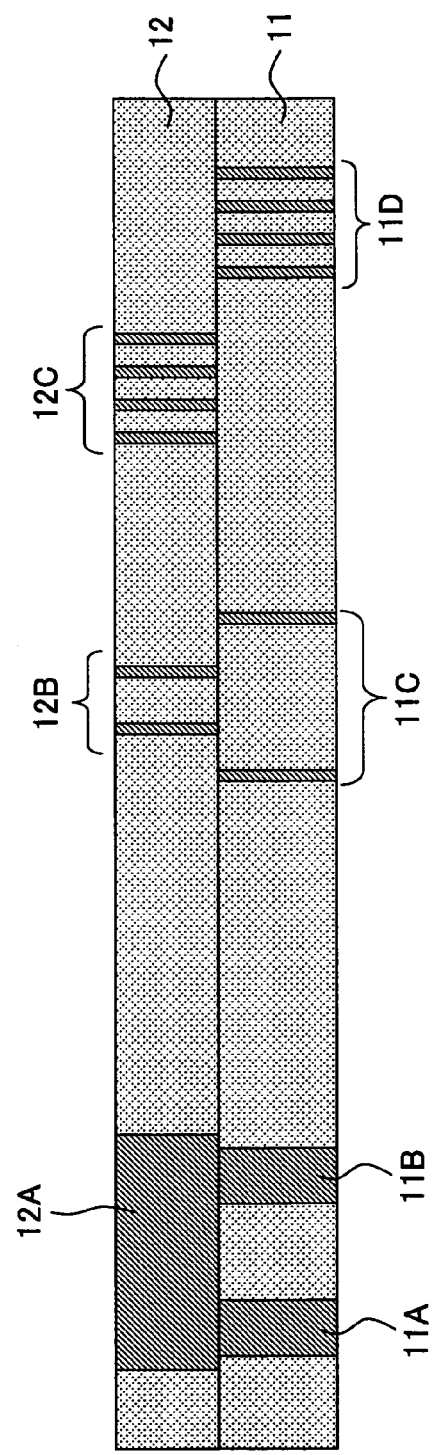

FIG.4
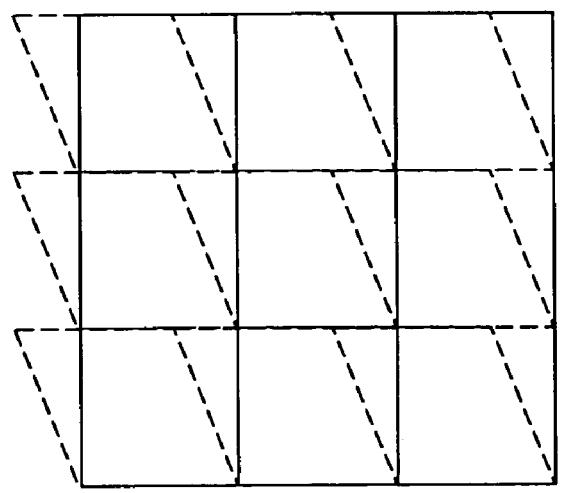
ChipRot X
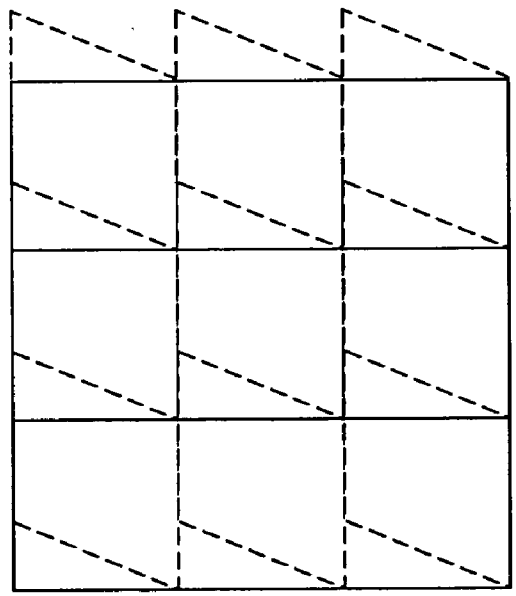
ChipRot Y

FIG. 6

FABRICATION METHOD OF SEMICONDUCTOR DEVICE

CROSS-REFERENCE TO RELATED APPLICATION

The present application is based on Japanese priority applications No. 2004-230834 and No. 2004-377038 respectively filed on Aug. 6, 2004 and Dec. 27, 2004, the entire contents of which are hereby incorporated by reference.

BACKGROUND OF THE INVENTION

The present invention generally relates to fabrication of semiconductor devices and more particularly to the technology of alignment of exposure apparatus.

With increasing speed and functional diversity of semiconductor devices, extremely miniaturized patterns are formed nowadays on the surface of semiconductor wafers. Associated with this, there exists an increasing demand for more accurate alignment in the photolithographic process, particularly in the exposure step of semiconductor wafers conducted by using an exposure apparatus.

In the fabrication process of semiconductor devices, it has been practiced to achieve alignment of semiconductor patterns with regard to an underlying semiconductor pattern at the time of exposure process by measuring the coordinate of alignment marks formed in each of the chip regions arranged in rows and columns on a semiconductor wafer.

REFERENCES

Japanese Unexamined Patent Publication 2002-231596
Japanese Unexamined Patent Publication 2002-64046
Japanese Unexamined Patent Publication 2004-71622

SUMMARY OF THE INVENTION

FIGS. 1A and 1B are respectively a plan view and a cross-sectional view showing an example of alignment of upper and lower layers on such a semiconductor substrate.

Referring to FIGS. 1A and 1B, there is formed a first interlayer insulation film 11 on a silicon substrate (not shown) formed with active devices such as a MOS transistor, wherein the first interlayer insulation film 11 includes contact plugs 11A and 11D, an alignment verification pattern 11C and an alignment mark 11D, wherein the interlayer insulation film 11 carries thereon a second interlayer insulation film 12 including therein an interconnection pattern 12A contacting with the contact plugs 11A and 11B, an alignment verification 12B corresponding to the alignment verification pattern 11C, and an alignment mark 12C.

Thus, in the case of forming the interconnection patterns 12A, 12B and 12C in the interlayer insulation film 12, alignment is achieved with reference to the alignment mark 11D in the interlayer insulation film 11, and the alignment result is confirmed by a microscope (alignment error detection device equipped with an optical microscope) by examining the relationship between the alignment verification pattern 11C and the alignment verification pattern 12B.

In many cases, the alignment verification patterns 11C and 12B or the alignment marks 11D and 12C are formed of a pattern having a step, and thus, detection thereof is possible even after the upper layer is formed. Further, it should be noted that the alignment between the contact plug 11A or 11B and the interconnection pattern 12A is achieved with regard to the contact plug 11A or 11B and the resist pattern formed on the interlayer insulation film 12 in correspondence to the interconnection pattern 12A.

Further, the alignment of the next interlayer insulation film is achieved by using the alignment mark 12C included in the interlayer insulation film 12.

FIG. 2 is a diagram showing the exposure of semiconductor chip patterns on a semiconductor wafer.

Referring to FIG. 2, there are formed semiconductor chip regions $20C_1$, $20C_2$, $20C_3$, . . . on a semiconductor wafer 10 in rows and columns, and in correspondence to each of the semiconductor chip regions, there are formed an alignment mark 20X for the alignment in the X direction and an alignment mark 20Y for the alignment in the Y direction in the scribe region of the semiconductor wafer 20 in correspondence to the alignment mark 11D or 12C noted before.

For such alignment, it is first necessary to control the alignment error of the patterns within the wafer, wherein the alignment error occurring in such wafer alignment includes: translational error in the X and Y directions (ShiftX, ShiftY); magnification error in the X and Y directions (WaferMagX, WaferMagY); and rotational error in the X and Y directions (WaferRotX, WaferRotY), wherein the wafer alignment is conducted for the patterns on the wafer to be aligned with reference to the patterns on the wafer to which the alignment is to be achieved. Thereby, the alignment is achieved in terms of the "alignment lattice", which is defined on the semiconductor wafer such that each chip on the semiconductor wafer is represented by the center of each cell defined by the alignment lattice. Further, it is necessary to control the alignment error of the patterns within each chip (chip alignment), wherein the alignment error occurring in the chip alignment includes: magnification error in the X and Y directions (ChipMagX, ChipMagY); and rotational error in the X and Y directions (ChpRotX, ChipRotY).

FIGS. 3 and 4 show the deformation of patterns caused on a semiconductor wafer and on a chip and corresponding to the foregoing corrections.

Conventionally, it has been practiced, in order to achieve such positional alignment at the time of exposure of semiconductor wafers of product lot, to process a pilot wafer at first, and feedback the result of the alignment error detection achieved for such a pilot wafer, to the processing of the wafers of the product lot. Alternatively, it has been practiced to refer to the processing lot history of the past and predict the optimum alignment correction parameters. Particularly, the former is used frequently in the processing line for the purpose of development, while the use thereof in the production line is not common in view of severe deterioration of productivity in the exposure process.

Because of these reasons, it is currently practiced in the production line of semiconductor devices to achieve the positional alignment by using the history data of the past. In this case, however, there arises a problem of how to predict the alignment error, which tends to increase with time or with the lot number.

As mentioned previously, positional alignment includes: wafer alignment achieved for the overall wafer and hence for the chip center of gravity, conducted by using the parameters (ShiftX, ShiftY, WaferMagX, WaferMagY); and chip alignment achieved for each chip conducted by using the parameters (ChipMagX, ChipMagY, ChipRotX, ChipRotY).

In order to achieve the chip alignment with high precision, it has been required to provide plural alignment marks within each chip for detecting the alignment error in the X and Y directions, while there arise problems such as limited area available on the scribe lines for formation of such alignment marks, or decrease of throughput of exposure caused by increase of the measuring time of the alignment marks. It is not possible to increase the number of the alignment marks arbitrarily.

It should be noted that alignment with regard to the chip center of gravity, and thus, the alignment with regard to the parameters ShiftX, ShiftY, WaferMagX, WaferMagY, WaferRotX and WaferRotY, are dependent on various factors such as: exposure apparatus and exposure condition (optical parameters such as numerical aperture NA, illumination condition, lens distortion, etc.); precision of mask pattern arrangement; exposure apparatus and exposure condition (optical parameters such as numerical aperture NA, illumination condition, lens distortion, etc.) used for exposure of the upper pattern, which is to be aligned with reference to the lower pattern; the precision of the mask pattern arrangement, an the like.

Thereby, it has been possible to predict the alignment correction parameters with sufficient precision by using the alignment technology of the exposure apparatus itself. Generally, this has been achieved by extrapolating the optimum alignment parameters of the past that could successfully achieve the alignment of the upper pattern to the lower pattern, under the condition in which all the alignment error factors are identical, more specifically according to a simple moving average of the equation:

[optimum exposure control parameter value of the
    exposure apparatus at the time of alignment]=
    [set value of alignment control parameter of the
    exposure apparatus at the time of alignment]-
    [alignment error result of the lower pattern
    parameter and upper pattern parameter].

On the other hand, with regard to the pattern arrangement of individual chips, it is difficult to achieve precise prediction unless there are provided plural alignment marks within the chip for measurement of the alignment errors. Thus, there has been a tendency that magnification errors or rotational errors are caused at the time of the alignment of the chip patterns, resulting in decrease of productivity such as increase of the repair works or decrease of the yield.

Further, with regard to the alignment error for the wafer as a whole, there are cases in which the alignment error is deviated significantly over the prediction when the lot number has exceeded a particular lot number. In such a case, alignment by way of extrapolation is not possible. It should be noted that such large deviation is tend to be caused in recent high-performance exposure apparatuses due to the malfunctioning of its complex mechanism or control error caused by environmental disturbance.

Thus, there is a demand for efficient alignment method and exposure method capable of improving, when exposing complex semiconductor patterns inside a chip region defined on a semiconductor wafer consecutively in a superimposed relationship, particularly under the circumstances in which there is little room for providing plural alignment marks inside the chip region, the precision of prediction of the correction parameters set to an exposure apparatus for those alignment errors shown in FIGS. 3 and 4, except for the translational error of the chip center of gravity (ShiftX, ShiftY).

According to a first aspect of the present invention, there is provided a method of fabricating a semiconductor device that includes an exposing process in which a lower pattern is formed by a first exposing process and an upper pattern is formed thereon by a second exposing process, said exposing process comprising: an earlier exposure step of aligning and exposing, in a just-before lot conducted immediately before a current lot, an upper pattern on a substrate of said just-before lot, on which a lower pattern is formed by said first exposing process, by conducting said second exposing process such that said upper pattern is in alignment with said lower pattern; and a latter exposure step of aligning and exposing, in said current lot, an upper pattern on a substrate of said current lot, on which a lower pattern is formed by said first exposing process, by conducting said second exposing process such that said upper pattern is in alignment with said lower pattern on said substrate of said current lot, said exposure process further comprising the steps of: obtaining a first correction value representing a difference of first and second alignment error correction parameter preset values respectively used at the time of said first exposing process of exposing said lower patterns in said current lot and in said just-before lot; obtaining, as a second correction value, an optimum correction amount of a third alignment error correction parameter preset value, which has been needed for proper alignment of said upper pattern in said second exposing process of said just-before lot, said third alignment error correction parameter has been used in said second exposing process of said just-before lot for exposing said upper pattern; obtaining an optimum correction parameter prediction value to be used for exposing said upper pattern in said second exposing process of said current lot, from said first correction value and said second correction value; and exposing said upper pattern of said current lot in said latter exposure step while using said optimum parameter prediction value.

In another aspect, the present invention provides a method of fabricating a semiconductor device that includes an exposing process in which a lower pattern is formed by a first exposing process and an upper pattern is formed thereon by a second exposing process, said exposing process comprising: an earlier exposure step of aligning and exposing, in a just-before lot conducted immediately before a current lot, an upper pattern on a substrate of said just-before lot, on which a lower pattern is formed by said first exposing process, by conducting said second exposing process such that said upper pattern is in alignment with said lower pattern; and a latter exposure step of aligning and exposing, in said current lot, an upper pattern on a substrate of said current lot, on which a lower pattern is formed by said first exposing process, by conducting said second exposing process such that said upper pattern is in alignment with said lower pattern on said substrate of said current lot, said exposure process further comprising the steps of: obtaining first and second alignment error correction parameter preset values used respectively for alignment of said lower patterns at the time of said first exposing process of exposing said lower pattern respectively in said current lot and said just-before lot; obtaining an optimum correction amount needed for correcting an alignment error correction parameter preset value used in said second exposing process of said earlier exposure step for exposing said upper pattern in said just-before lot with proper alignment; obtaining an optimum correction parameter preset value used in said second exposing process of said latter exposure step for exposing said upper pattern of said current lot, from said first alignment error correction parameter preset value, said second alignment error correction parameter preset value and said optimum correction amount; and exposing said upper pattern of said current lot in said second exposing process of said latter exposure step, while using said optimum correction parameter preset value.

According to the present invention, it becomes possible to predict the alignment correction parameters with high precision at the time of fabrication of a semiconductor device particularly for the case in which it is not possible to provide sufficient number of alignment marks inside a chip region because of limited space available for formation of the alignment marks or because of the requirement of throughput, for not only the errors for the translation of the chip center of gravity (ShiftX, ShiftY) but also for the errors in the wafer magnification (WaferMagX, WaferMagY) or wafer distortion (WaferRotX, WaferRotY) respectively about the X and Y axes over the entire wafer, and further for the errors in the magnification (ChipMagX, ChipMagY) and distortion (ChipRotX, ChipRotY) respectively about the X and Y-axes for each of the chip regions. Further, according to the present invention, while it is necessary to carry out the processing of a pilot wafer in the first lot, there is no need of processing a pilot wafer in the second lot and the lots thereafter. Thereby, the productivity of exposure process is improved and so is the yield of production of the semiconductor device.

Further, it should be noted that the present invention is effective also in the case in which plural alignment marks are disposed inside a chip region.

Further, according to the present invention, it becomes possible to carry out the exposure with minimum alignment error at the time of fabricating a semiconductor device according to the fabrication process that includes an exposing process in which a lower pattern is formed by a first exposing process and an upper pattern is formed thereon by a second exposing process, said exposing process comprising: an earlier exposure step of aligning and exposing, in a just-before lot conducted immediately before a current lot, an upper pattern on a substrate of said just-before lot, on which a lower pattern is formed by said first exposing process, by conducting said second exposing process such that said upper pattern is in alignment with said lower pattern; and a latter exposure step of aligning and exposing, in said current lot, an upper pattern on a substrate of said current lot, on which a lower pattern is formed by said first exposing process, by conducting said second exposing process such that said upper pattern is in alignment with said lower pattern on said substrate of said current lot, said exposure process further comprising the steps of: obtaining first and second alignment error correction parameter preset values used respectively for alignment of said lower patterns at the time of said first exposing process of exposing said lower pattern respectively in said current lot and said just-before lot; obtaining an optimum correction amount needed for correcting an alignment error correction parameter preset value used in said second exposing process of said earlier exposure step for exposing said upper pattern in said just-before lot with proper alignment; obtaining an optimum correction parameter preset value used in said second exposing process of said latter exposure step for exposing said upper pattern of said current lot, from said first alignment error correction parameter preset value, said second alignment error correction parameter preset value and said optimum correction amount; and exposing said upper pattern of said current lot in said second exposing process of said latter exposure step, while using said optimum correction parameter preset value.

BRIEF DESCRIPTION OF THE DRAWINGS

FIGS. 1A and 1B are respectively a plan view and a cross sectional view showing a part of a semiconductor device in which first and second patterns including an alignment mark and an alignment verification mark are formed;

FIGS. 3 and 4 are diagrams showing examples of alignment error occurring in the chip pattern of FIG. 2;

FIG. 6 is a diagram showing an exposure process according to an embodiment of the present invention that uses the exposure system of FIG. 5;

DETAILED DESCRIPTION OF THE INVENTION

[First Embodiment]

Figure 2:
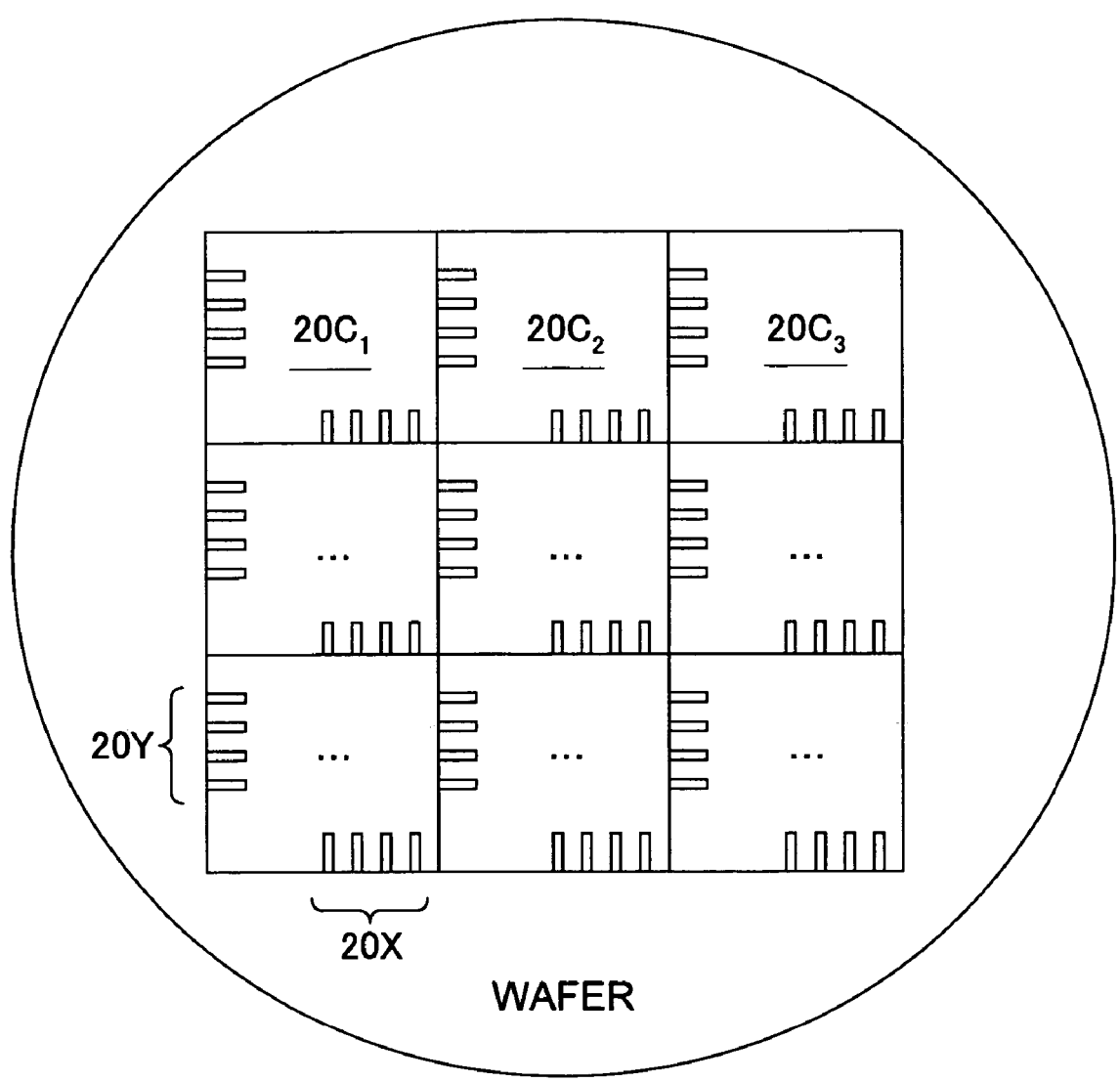
FIG. 2 is a diagram showing an example of a chip pattern formed on a semiconductor wafer.
Figure 3:
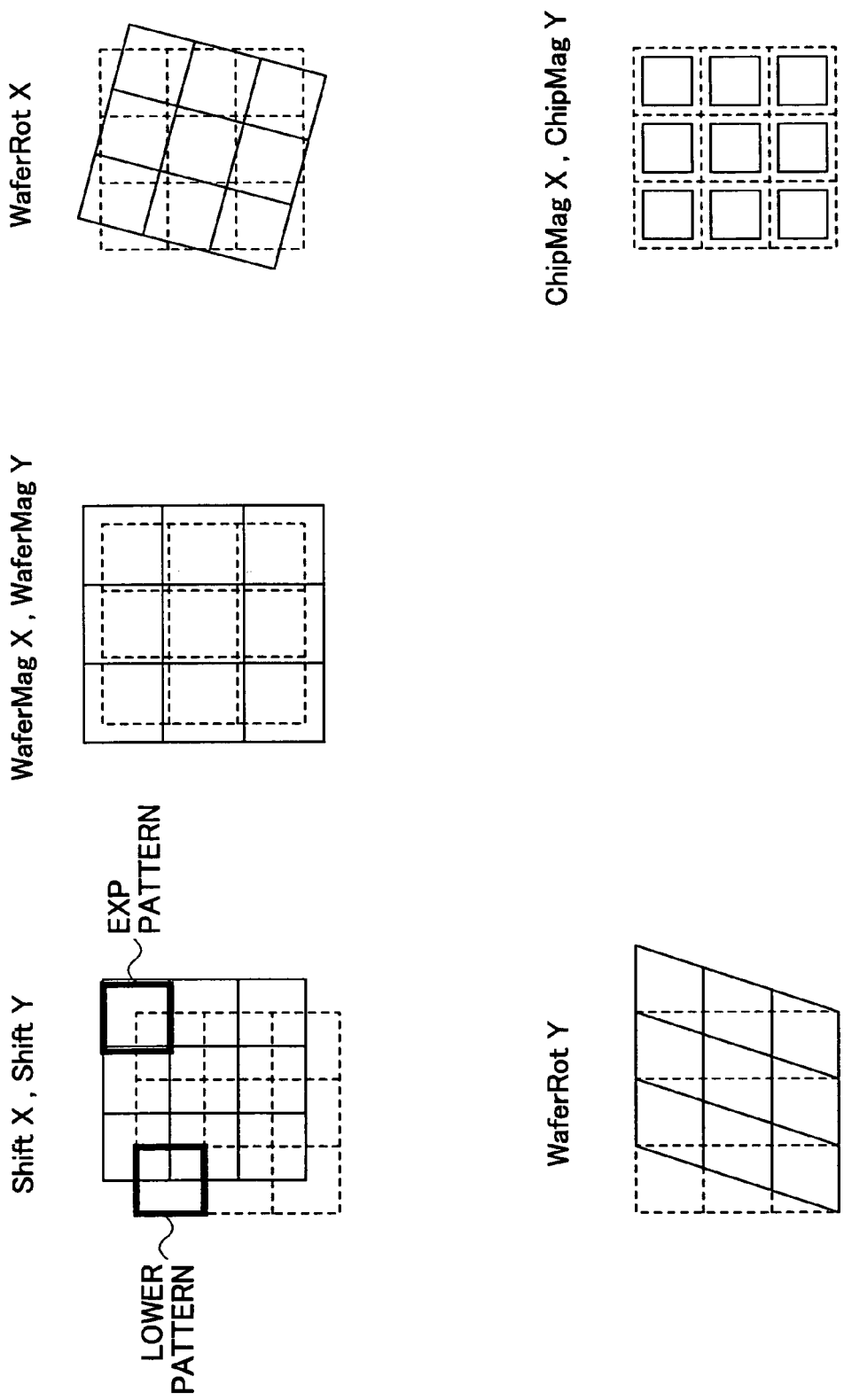
Figure 5:
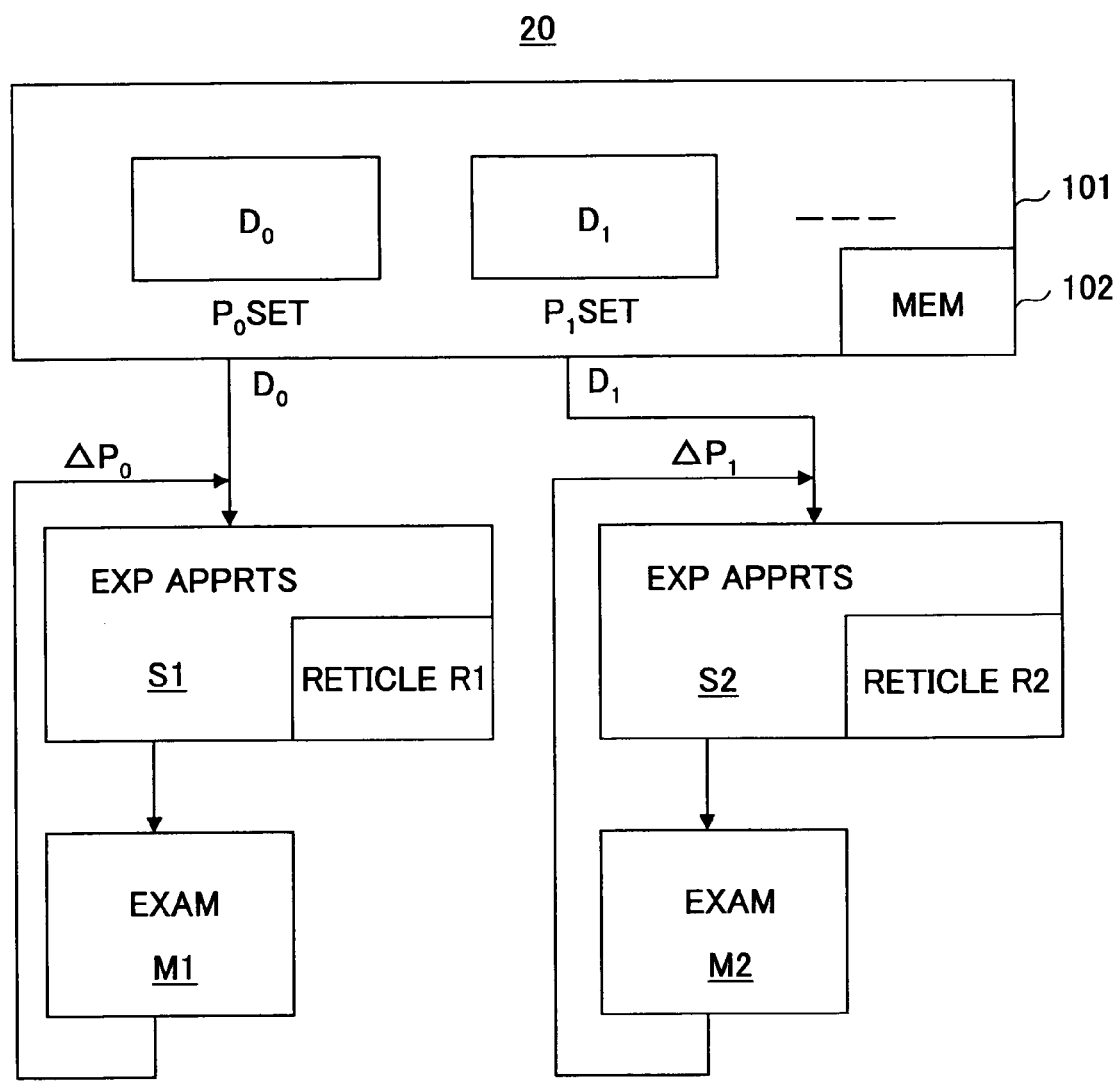
FIG. 5 is a diagram showing the construction of an exposure system according to a first embodiment of the present invention.

FIG. 5 is a diagram showing the construction of an exposure system 20 used with the present invention.

Referring to FIG. 5, the exposure system 20 includes at least two exposure apparatuses S1 and S2 respectively having reticles, and a control unit 101 holding exposure data D0 and D1 and controlling the exposure apparatuses S1 and S2 with the exposure data D0 and D1, wherein there cooperates an examination device M1 including a microscope with the exposure apparatus S1, while an examination device M2 including a microscope cooperates with the exposure apparatus S2. In the example of FIGS. 1A and 1B, the exposure data D0 is used for patterning the lower layer 11 and the exposure data D1 is used for the patterning of the upper layer 12.

It should be noted that the control unit 100 provides, at the time of carrying out exposure by the exposure apparatuses S1 and S2, the preset values P0set and P1set of the alignment error correction parameter to the exposure apparatuses S1 and S2 for compensating for the alignment error of the exposure pattern explained before.

Here, it should be noted that the preset value P0set is an alignment error correction parameter used for correcting the alignment error of the first exposure apparatus S1 at the time of exposure of the lower layer 11 and includes in fact ten alignment error correction parameters: ShiftX; ShiftY; WaferMagX; WaferMagY; WaferRotX; WaferRotY; ChipMagX; ChipMagY; ChipRotX; and ChipRotY explained before.

Similarly, the foregoing preset value P1set is an alignment error correction parameter used for correcting the alignment error in the second exposure apparatus S2 at the time of exposure of the upper layer 12 and includes in fact ten alignment error correction parameters: ShiftX; ShiftY; WaferMagX; WaferMagY; WaferRotX; WaferRotY; ChipMagX; ChipMagY; ChipRotX; and ChipRotY explained before.

In each of the exposure apparatuses S1 and S2, the patterns shown in FIGS. 1A and 1B are processed repeatedly from the Lot #1 to Lot #j.

It should be noted that these correction parameters change with each lot, and thus, it is needed, with such exposure technology in which plural patterns are superimposed, to provide a correction algorithm for obtaining an optimum correction parameter that minimizes the alignment error between the exposed patterns formed as a result of the exposure.

Figure 6:
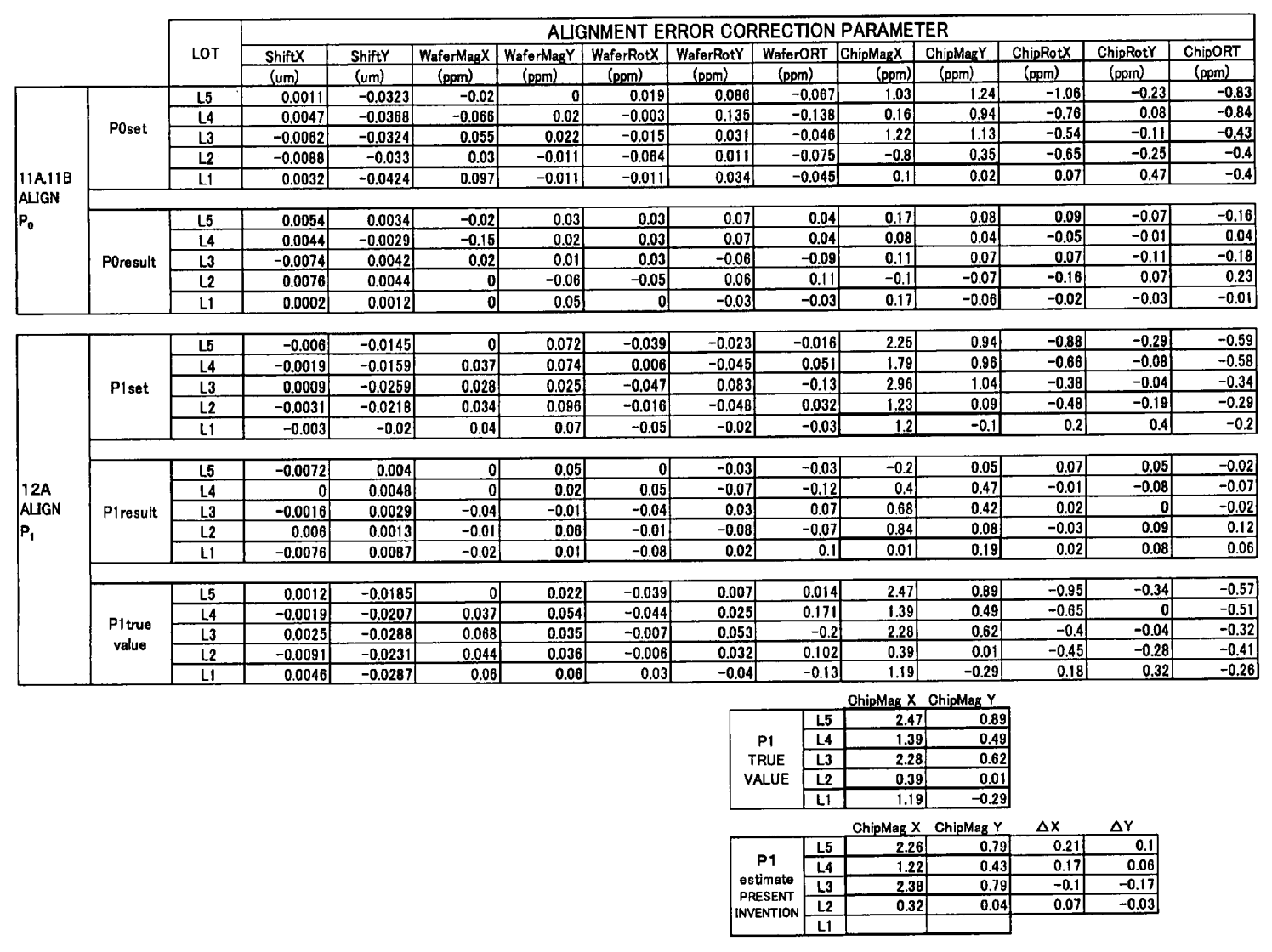

FIG. 6 shows the initial values P0set and P1set respectively used for exposing the upper pattern (formed by process P1) on the lower pattern (formed by process P0) while using the exposure system 20 of FIG. 5 in terms of ppm, and further the alignment error result parameters P0result and P1result respectively representing the alignment error result for the case of using the foregoing initial values P0set and P1set also in terms of ppm.

In FIG. 6, it should be noted that the parameter P1truevalue represents the true value of P1 and is defined as P1truevalue=P1set−P1result. Thus, the parameter P1result should become zero in the case there holds the relationship P1truevalue=P1 (optimum value) and the parameter P1truevalue has been used for the preset value in place of P1setvalue. The same applies also to P0truevalue.

It should be noted that the foregoing alignment error result parameters P0result and P1result, or the true value corresponding to these, are obtained from the exposure patterns of the past including the Lot#1–Lot#j by means of the foregoing examination devices M1 and M2, and are held in a memory unit 102 provided in a part of the control unit 101 of FIG. 5. Here, it should be noted that the alignment error result parameters P0result and P1result are observed values obtained from the alignment verification patterns 11C and 11D shown in FIGS. 1A and 1B.

Referring to FIG. 6, the preset values P0set and P1set, and the alignment error result parameters P0result and P1result are defined for each of ShiftX, ShiftY, WaferMagX, WaferMagY, WaferRotX, WaferRotY, ChipMagX, ChipMagY, ChipRotX, ChipRotY (P0set(ShiftX); P0set(ShiftY); P0set(WaferMagX); P0set(WaferMagY); P0set(WaferRotX); P0set(WaferRotY); P0set(ChipMagX); P0set(ChipMagY); P0set(ChipRotX); P0set(ChipRotY); P1set(ShiftX); P1set(ShiftY); P1set(WaferMagX); P1set(WaferMagY); P1set(WaferRotX); P1set(WaferRotY); P1set(ChipMagX); P1set(ChipMagY); P1set(ChipRotX); P1set(ChipRotY)). Thereby, it should be noted that each parameter is obtained for each of the Lot#1–Lot#j. In the illustrated example, it should be noted that Lot#1 is the oldest and Lot#5 is the newest.

Figure 7:
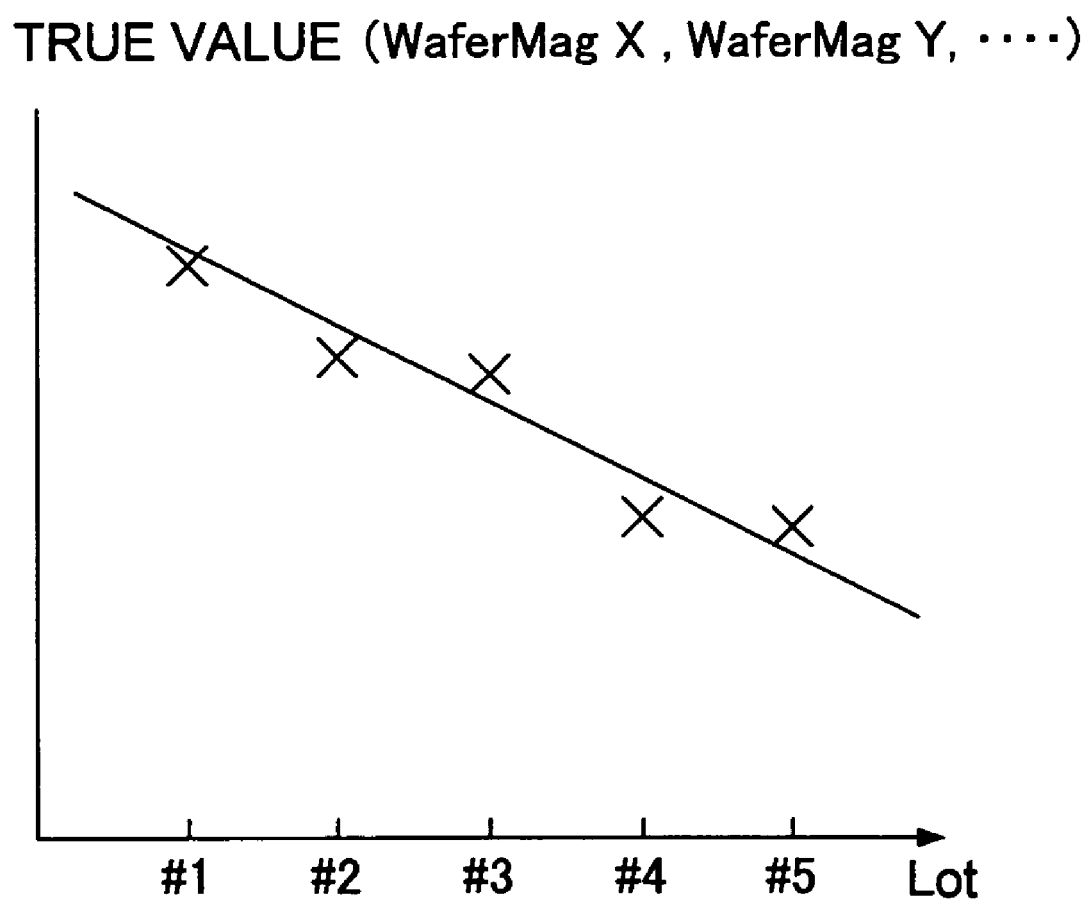
FIG. 7 is a diagram showing the method of obtaining a preset value of the alignment error correction parameter used with the exposure process of FIG. 6.

In the present embodiment, it should be noted that the control unit 101 determines the preset values P0set and P1set of the exposure apparatuses S1 and S2 for those parameters other than the parameters ChipMagX and ChipMagY, from the moving average of the past trend of the true values such as the one shown in FIG. 7, or alternatively by the polynomial approximation representing the variation of the true value with the exposure processing time.

From FIG. 6, it can be seen that, in the case the foregoing preset values are obtained from the past trend as such, the errors resulting from the use of the preset values P0result and P1result do not exceed 0.50 ppm in any of the cases of aligning the contact plugs 11A and 11B in the layer 11 or the interconnection pattern 12A in the layer 12 in the model structure of FIGS. 1A and 1B apart from the translational error (ShiftX, ShiftY), except for the foregoing parameter ChipMagX. Thus, FIG. 6 indicates that a satisfactory prediction is achieved for the alignment error correction parameters, except for the parameter ChipMagX.

On the other hand, in the case of aligning the interconnection pattern 12A, it can be seen in FIG. 6 that there are cases in which the alignment error result parameter, P1result, takes a value exceeding 0.5 ppm (lot#2 and lot#3) with regard to the foregoing parameter ChipMagX.

In such a case, it is not possible to sufficiently compensate for the distortion of the actual exposure pattern, as long as the preset value P1set obtained from the past trend is used. Further, with regard to the parameter ChipMgY, too, there are cases in which the alignment error result parameter P1result takes a value close to 0.5 ppm (0.47 for lot#4; and 0.42 for lot#3).

In view of the foregoing situation, the present embodiment obtains the corrected value Estimate(ChipMagX,$L_5$) of the alignment error correction parameter ChipMagX of the lot#5 from the quantity (P0set(ChipMagX,$L_5$)−P0set(ChipMagX,$L_4$)) representing a difference of the preset values set to the first exposure apparatus S1 for aligning and exposing the lower patterns 11A and 11B (process P0) between the current lot (lot#5) and the just-before lot (lot#4), and further from the quantity (P1set(ChipMagX,$L_4$)−P1result(ChipMagX,$L_4$) representing a difference between the preset value (P1set(ChipMagX,$L_4$)) for aligning and exposing the interconnection pattern 12A (process P1) for the foregoing just-before lot (lot#4) and the result of the alignment error measurement (P1result(ChipMagX,$L_4$) for the same just-before lot (lot#4), according to the relationship $$\text{Estimate}(ChipMagX, L_5) = \qquad (1)$$
$$\{P0set(ChipMagX, L_5) - P0set(ChipMagX, L_4)\} +$$
$$\{P1set(ChipMagX, L_4) - P1result(ChipMagX, L_4)\}$$

In the present example, the corrected alignment error correction parameter Estimate(ChipMagX,$L_5$) takes the value of (1.03−0.16)+(1.79−0.4)=2.26(ppm), while it should be noted that this value is offset only by 0.21 ppm (ΔX in FIG. 6) from the true value 2.47 of ChipMagX for the lot #5 (=P1set(ChipMagX,$L_5$)−P1result(ChipMagX,$L_5$)=2.25−(−0.22)=2.47).

Similarly, the corrected alignment error correction parameter Estimate(ChipMagY,L5) for the parameter ChipMagY is obtained according to the relationship $$\text{Estimate}(ChipMagY, L_5) = \qquad (2)$$
$$\{P0set(ChipMagY, L_5) - P0set(ChipMagY, L_4)\} +$$
$$\{P1set(ChipMagY, L_4) - P1result(ChipMagY, L_4)$$

In this case, the corrected alignment error correction parameter Estimate(ChipMagY,L5) takes the value (1.24−0.94)+(0.96−0.47)=0.79(ppm), while this value is offset only by 0.1 ppm (ΔY in FIG. 6) from the true value 0.89 of ChipMagY for the lot #5 (=P1set(ChipMagY,L5)−P1result(ChipMaY,L5)=0.94−0.05=0.89.

Generalizing the foregoing equations (1) and (2), the present embodiment obtains the corrected alignment error correction parameter Estimate(ChipMagX,Y, Lj) for the j-th lot (Lj) according to the relationship $$\text{Estimate}(ChipMagX, Y, L_j) = \quad (3)$$
$$\{P0set(ChipMagX, Y, L_j) - P0set(ChipMagX, Y, L_{j-1})\} +$$
$$\{P1set(ChipMagX, Y, L_{j-1}) - P1result(ChipMagX, Y, L_{j-1})\}$$

According to the foregoing method, it becomes possible to expose, in the current lot, an upper pattern 12A on a substrate, on which lower patterns 11A and 11B of the current lot are formed already by using the first exposure apparatus S1, by using the second exposure apparatus S2 such that the upper pattern 12A is in alignment with the lower patterns 11A and 11B while setting an optimum correction parameter preset value to the second exposure apparatus S2. The process is summarized in the flowchart of FIG. 8.

Figure 8:
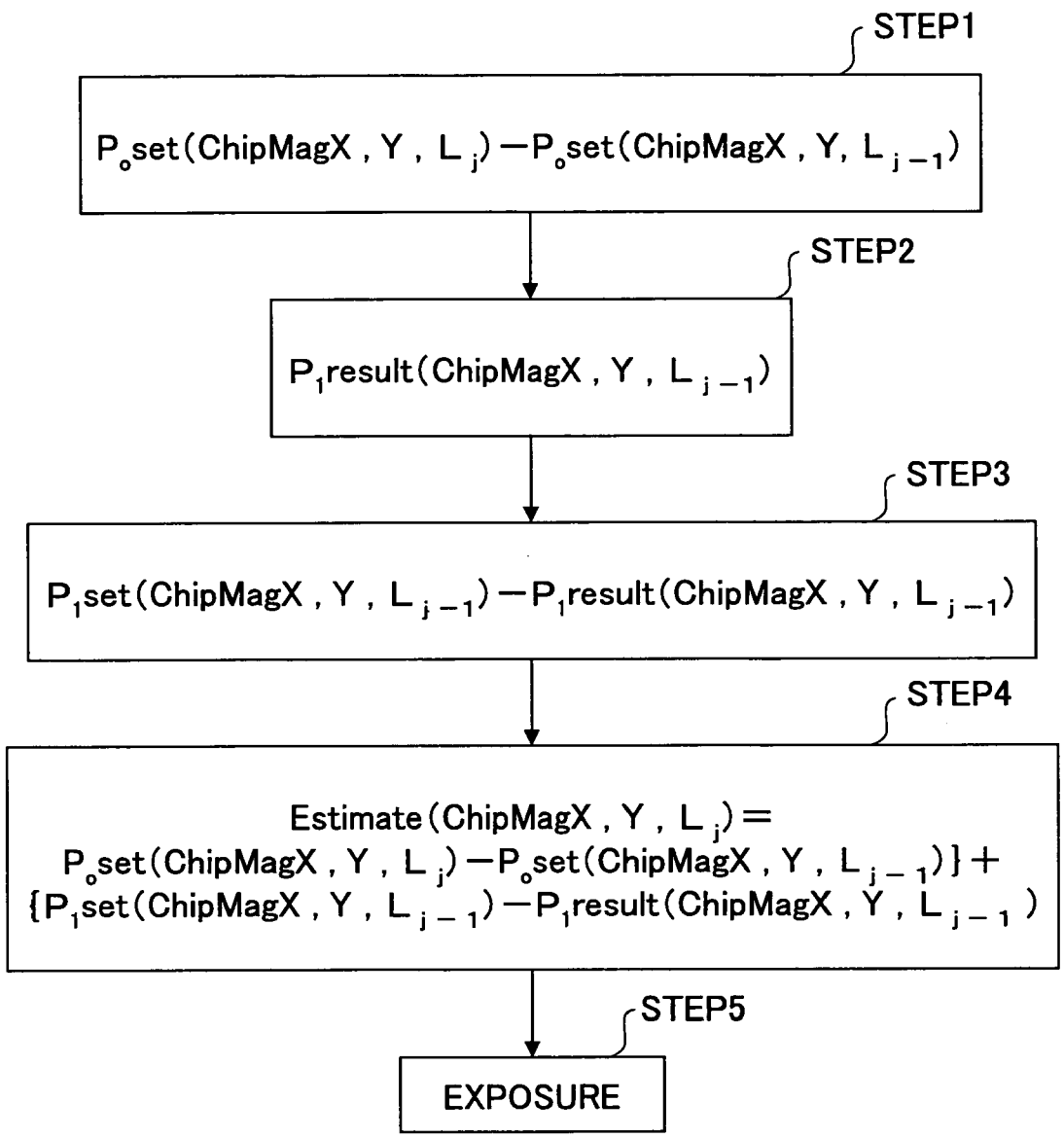
FIG. 8 is a flowchart showing an exposure process according to a first embodiment of the present invention.

Referring to FIG. 8, a first correction value [P0set(ChipMagX,Y, $L_j$)–P0set(ChipMagX,Y, $L_{j-1}$)], indicative of a difference between first and second alignment error correction parameters given to the first exposure apparatus S1 respectively for the exposure of the current lot and for the exposure of the just-before lot for alignment of the lower patterns 11A and 11B, is obtained in the first step 1.

Next, as shown in the second step 2, a second correction value P1result(ChipMagX,Y, $L_{j-1}$), representing the actual alignment error observed at the time exposing the upper pattern 12A in the just-before lot by using the second exposure apparatus S2, is obtained.

Further, in the step 3, a correction preset value (true value) that has been needed for the third alignment error correction parameter preset value P1set(ChipMagX,Y, $L_{j-1}$), which is given to the second exposure apparatus S2 at the time of exposure of the upper pattern 12A in the just-before lot, for proper alignment of the upper pattern 12A, is obtained as P1set(ChipMagX,Y, $L_{j-1}$)–P1result(ChipMagX,Y, $L_{j-1}$).

Further, in the step 4 of FIG. 8, the preset value of the alignment error correction parameter P0set(ChipMagX,Y, $L_j$), which is set to the first exposure apparatus S1 at the time of exposing the lower patterns 11A and 11B in the current lot by using the exposure apparatus S1, is corrected by the foregoing first and second correction values as [{P0set(ChipMagX,Y, $L_j$)–P0set(ChipMagX,Y, $L_{j-1}$)}+{P1set(ChipMagX,Y, $L_{j-1}$)–P1result(ChipMagX,Y, $L_{j-1}$)}], and with this, the optimum correction parameter preset value Estimate(ChipMagX,Y, $L_j$), which is set to the second exposure apparatus S2 at the time of exposure of the current lot, is obtained.

Further, in the step 5 of FIG. 8, the foregoing optimum correction parameter preset value is set to the second exposure apparatus S2 and the exposure for the pattern 12A of the current lot is carried out.

In the foregoing procedure, it should be noted that the actual error amount P1result(ChipMagX,Y, $L_{j-1}$) caused in the correction parameter set to the exposure apparatus S2 at the time of exposure of the lower patterns 11A and 11B in the just-before lot due to the causes attributed to the substrate is obtained from the actual measurement of the alignment verification pattern of the layer 11 shown in FIGS. 1A and 1B, and from this, the foregoing corrected preset value of the third alignment error correction parameter is obtained.

Although the foregoing embodiment has been explained for the case of obtaining the corrected alignment error correction parameter Estimate for the parameters ChipMagX and ChipMagy, it should be noted that the method of the present invention is applicable also to any of the items shown in FIG. 6.

Further, it should be noted that the preset values used in the foregoing process for the initial value of the alignment error correction parameters of the exposure apparatuses S1 and S2 are not limited to those obtained from the trend of the true value as explained before, but any arbitrary values can be used as long as they fall within the range in which the correction can be made.

Further, while the foregoing explanation has been made based on the assumption that the exposure apparatus S1 and the exposure apparatus S2 are different exposure apparatuses, it is also possible that these are the same exposure apparatus.

Further, while the relationship of Equation (3) has been defined with regard to the current lot #j and the just-before lot #j-1, it is also possible to define Equation (3) for the current lot #j and arbitrary lot of the past such as the lot number #j-1, #j-2, . . . . Thereby, it is also possible to determine the value of the parameter Estimate(ChipMagX, Y, $L_j$) from a simple average or weighted average of these.

FIGS. 9A–9D show examples of alignment achieved according to the present embodiment.

Figure 9A:
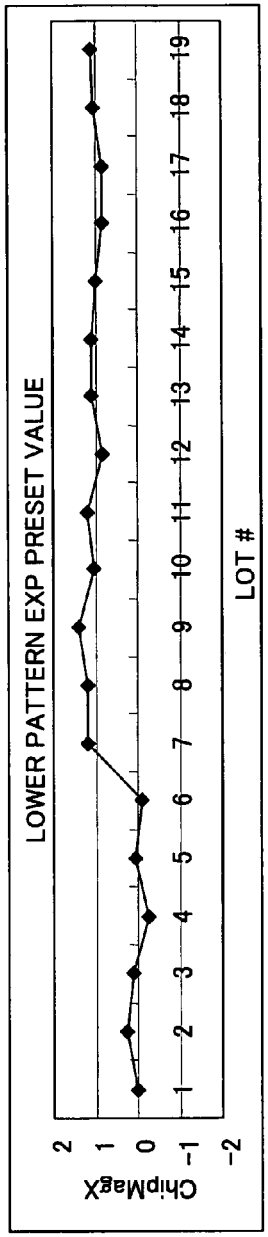
FIGS. 9A–9D are diagrams showing an exposure example of the first embodiment of the present invention.
Figure 9B:
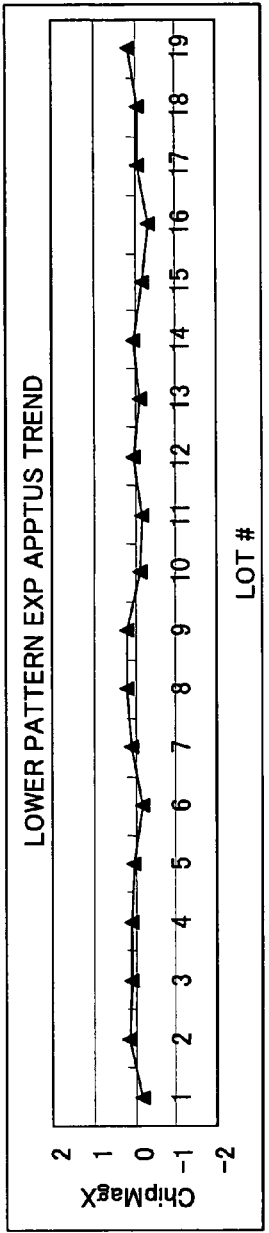

Referring to FIGS. 9A–9D, it should be noted that FIG. 9A represents the lot-to-lot variation of the alignment error correction parameter preset value set to the exposure apparatus S1 at the time of exposing the lower pattern (process P0) for the parameter ChipMagX, while FIG. 9B shows the alignment error trend of the exposure apparatus S1 used for the exposure of the lower pattern (process P0) for the same parameter ChipMagX.

Figure 9C:
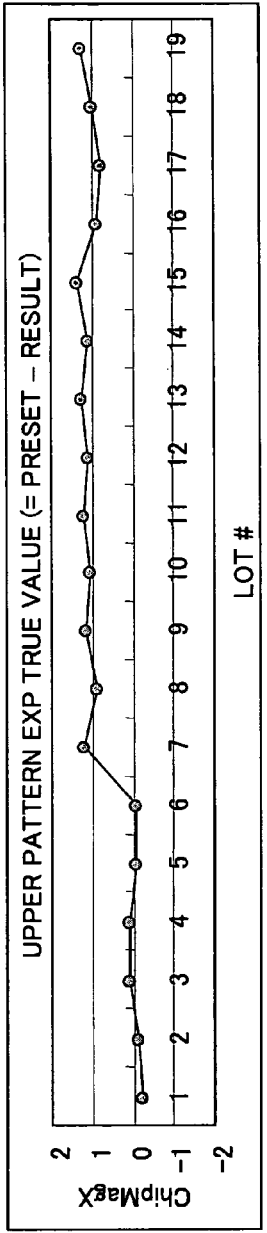
Figure 9D:
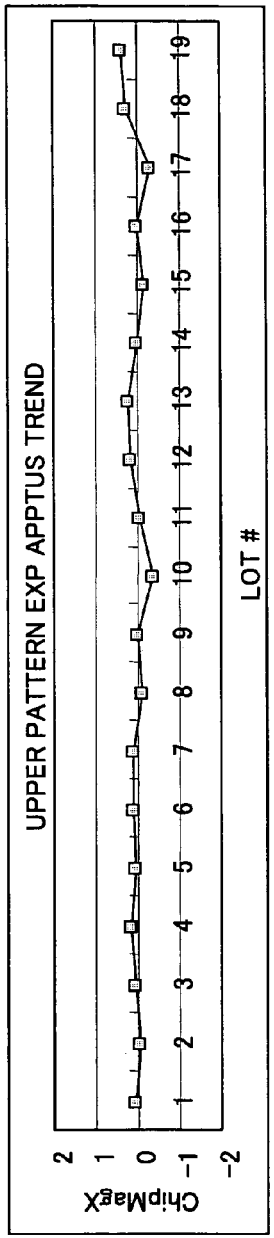

Further, FIG. 9C shows the lot-to-lot variation of the true value, in other words the error between the preset value of the alignment error correction parameter set to the exposure apparatus S2 at the time of the exposure of the upper pattern (process P1) and the observed exposure result, while FIG. 9D shows the alignment error trend of the exposure apparatus S2 used for exposing the upper pattern (process P1).

It should be noted that the example of FIGS. 9A–9D assumes that the state of the exposure apparatuses S1 and S2 are stable as shown in FIGS. 9B and 9D, and thus, the leap of the alignment correction parameter preset value P0set (ChipMagX, L7) observed for the lower pattern between the lot#6 and the lot #7 shown in FIG. 9A reflects the change of exposure condition occurred at the time of exposure of a further lower pattern between the lot#6 and the lot#7. In this case, it will be also noted that there is caused a corresponding leap in the exposure true value (=exposure preset value–exposure result) of the upper pattern between the lot#6 and the lot#7 as shown in FIG. 9C.

Thus, the present embodiment provides prediction of the exposure preset values causing a leap between the lot#6 and the lot#7 at the time of the exposure process (process P1) of the upper pattern, based on the leap of the preset values caused between the lot#6 and the lot#7 at the time of the exposure of the lower pattern (process P0) and the leap of the exposure true value observed between the lot#6 and the lot#7 at the time of the exposure process P0, for the case in which the exposure apparatuses S1 and S2 themselves are in the stable state.

[Second Embodiment]

FIGS. 10A–10D are diagrams showing the alignment method according to a second embodiment of the present invention.

Figure 10A:
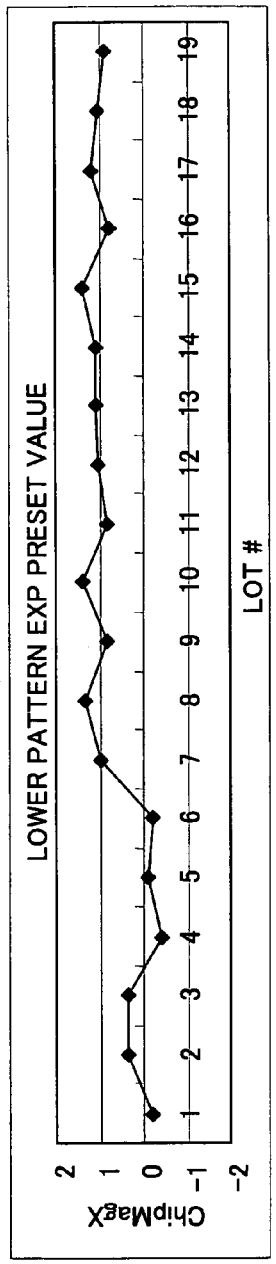
FIGS. 10A–10D are diagrams showing an exposure example of a second embodiment of the present invention.
Figure 10B:
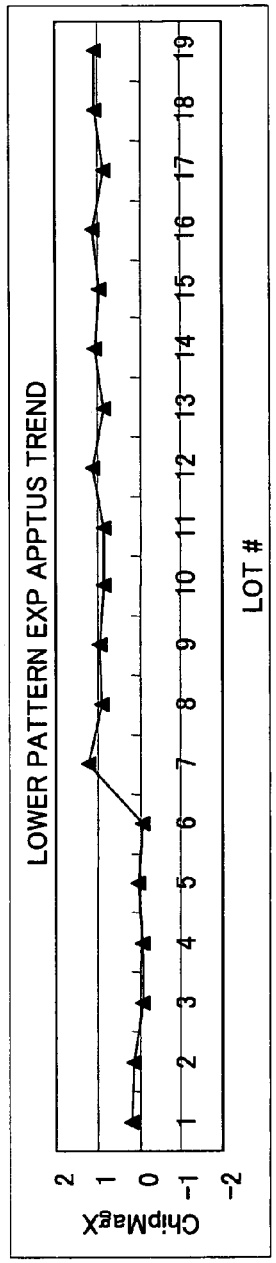

Referring to FIGS. 10A–10D, FIG. 10A represents the lot-to-lot variation of the preset value of the alignment error preset parameter provided to the exposure apparatus S1 at the time of exposing the lower pattern P0 for the parameter ChipMagX, while FIG. 10B shows the alignment error trend of the exposure apparatus used for the exposure of the lower pattern (process P0) with regard to the same parameter ChipMagX.

Figure 10C:
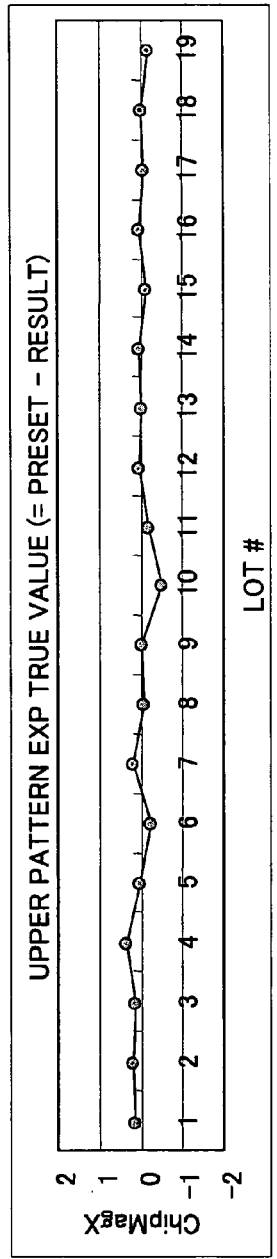
Figure 10D:
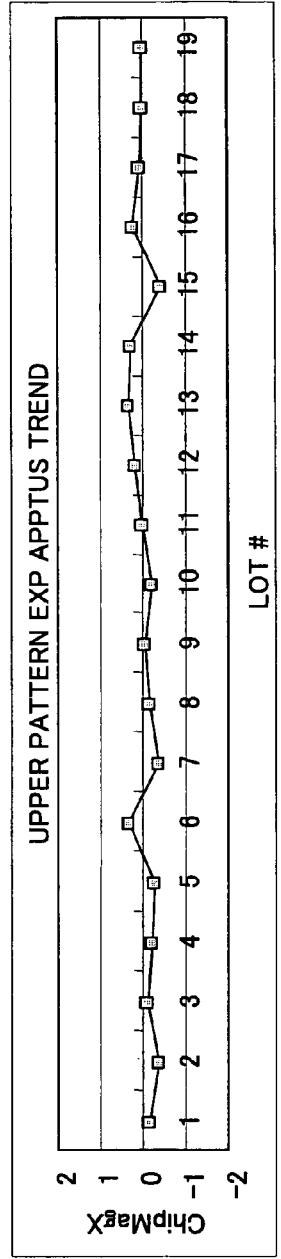

Further, FIG. 10C shows the lot-to-lot variation of the error between the alignment error correction parameter preset value provided to the exposure apparatus at the time of the exposure of the upper pattern (process P1) and the exposure result, and hence the lot-to-lot variation of the true value, while FIG. 10D shows the alignment error trend of the exposure apparatus S2 used for the exposure of the upper pattern with the process P1.

In the example of FIGS. 10A–10D, the state of the exposure apparatus is stable throughout as shown in FIG. 10D, while it can be seen that there is caused a leap in the state of the exposure apparatus S1 between the lot#6 and the lot#7 as shown in FIG. 10B, and in correspondence to this, there is caused a variation in the alignment error correction parameter preset value used at the time of the exposure of the lower pattern in the process P0 between the lot#6 and the lot#7 as shown in FIG. 10A. On the other hand, it can be seen that the exposure true value for the upper pattern shown in FIG. 10C takes a value almost zero in correspondence to the stability of the state of the exposure apparatus S2.

In such a case in which there is caused a variation of state in the exposure apparatus S1, it should be noted that the foregoing corrected alignment error correction parameter Estimate(ChipMagX,Y, $L_j$) is obtained as $$Estimate(ChipMagX, Y, L_j) = \\ \{P0set(ChipMagX, Y, L_j) - P0set(ChipMagX, Y, L_{j-1})\} + \\ \{P1set(ChipMagX, Y, L_{j-1}) - P1result(ChipMagX, Y, L_{j-1})\},$$

when the relationship of Equation (3) is applied directly, while this equation does not take into consideration the change of state of the exposure apparatus S1 that has caused the leap of the alignment correction parameter preset value from P0set(ChipMagX,Y, $L_6$) to P0set(ChipMagX,Y, $L_7$) between the lot#6 and the lot#7, and thus, direct application of Equation (3) to such a situation would result in a wrong prediction.

In order to obtain a correct result, is is necessary to modify the foregoing equation to $$Estimate(ChipMagX, Y, L_j) = \quad (4) \\ \{P0set(ChipMagX, Y, L7) - P0set(ChipMagX, Y, L6)\} + \\ \{P1set(ChipMagX, Y, L_{j-1}) - P1result(ChipMagX, Y, L_{j-1})\} - \\ \{E0(t = L_j) - E0(t = L_{1-j})\},$$

wherein it should be noted that $E0(t=L_j)$ represents the variation of the state of the exposure apparatus in the case the exposure processing P0 of the lot $\#L_j$ is carried out by using the exposure apparatus S1, and thus, the term $E0(t=L_j)-E0(t=L_{1-j})$ represents the amount of variation of the state of the exposure apparatus S1 from the lot #j-1 to the lot #j.

Thus, in the case of the example of FIGS. 10A–10D, it will be noted that the leap of the alignment error correction parameter preset value {P0set(ChipMagX,Y, L7)–P0set (ChipMagX,Y, L6)} between the lot #6 and the lot #7 is substantially cancelled out by the variation of the state of the exposure apparatus S1.

Thus, the present embodiment generalizes the foregoing relationship of Equation (3) to the relationship of Equation (4) by taking into consideration the variation of state of the exposure apparatus S1, while the equation (4) is further generalized, by taking into consideration the variation of state of the exposure apparatus S2, as $$Estimate(ChipMagX, Y, L_j) = \quad (5) \\ \{P0set(ChipMagX, Y, L_7) - P0set(ChipMagX, Y, L_6)\} - \\ \{E0(t = Lj) - E0(t = L_{1-j})\} + \\ \{P1set(ChipMagX, Y, L_{j-1}) - P1result(ChipMagX, Y, L_{j-1})\} - \\ \{E1(t = L_j) - E1(t = L_{1-j})\},$$

wherein $E1(t=Lj)$ represents the variation of the exposure apparatus S2 for the case the exposure processing P1 of the lot #Lj is carried out by the exposure apparatus S2 and the term $E1(t=L_j)-E1(t=L_{1-j})$ represents the amount of state of the exposure apparatus S2 from the lot #j-1 to the lot #j.

Thus, with the present embodiment, the corrected preset value of the alignment error correction parameter is obtained by taking into consideration the variation of state of the exposure apparatuses S1 and S2, wherein it should be noted that the foregoing variation of state $E0(t=L_j)$ or $E1(t=L_j)$ of the exposure apparatus S1 or S2 is not the quantity that can be obtained for each lot. Thus, these quantities have to be obtained by periodically processing a reference wafer and measuring the trend of alignment error. Alternatively, it is possible to construct a database for the difference between the prediction of Estimate(ChipMagX,Y, Lj) of the current lot #j and the true value ({P1set(ChipMagX,Y, Lj)–P1result (ChipMagX,Y, $L_j$)} while regarding the same as representing the variation of state of the exposure apparatus S2 in the case the foregoing difference exceeds a predetermined range. In this case, the state of the exposure apparatus S2 can be defined for an arbitrary time t by integrating the same on the time axis.

Figure 11:
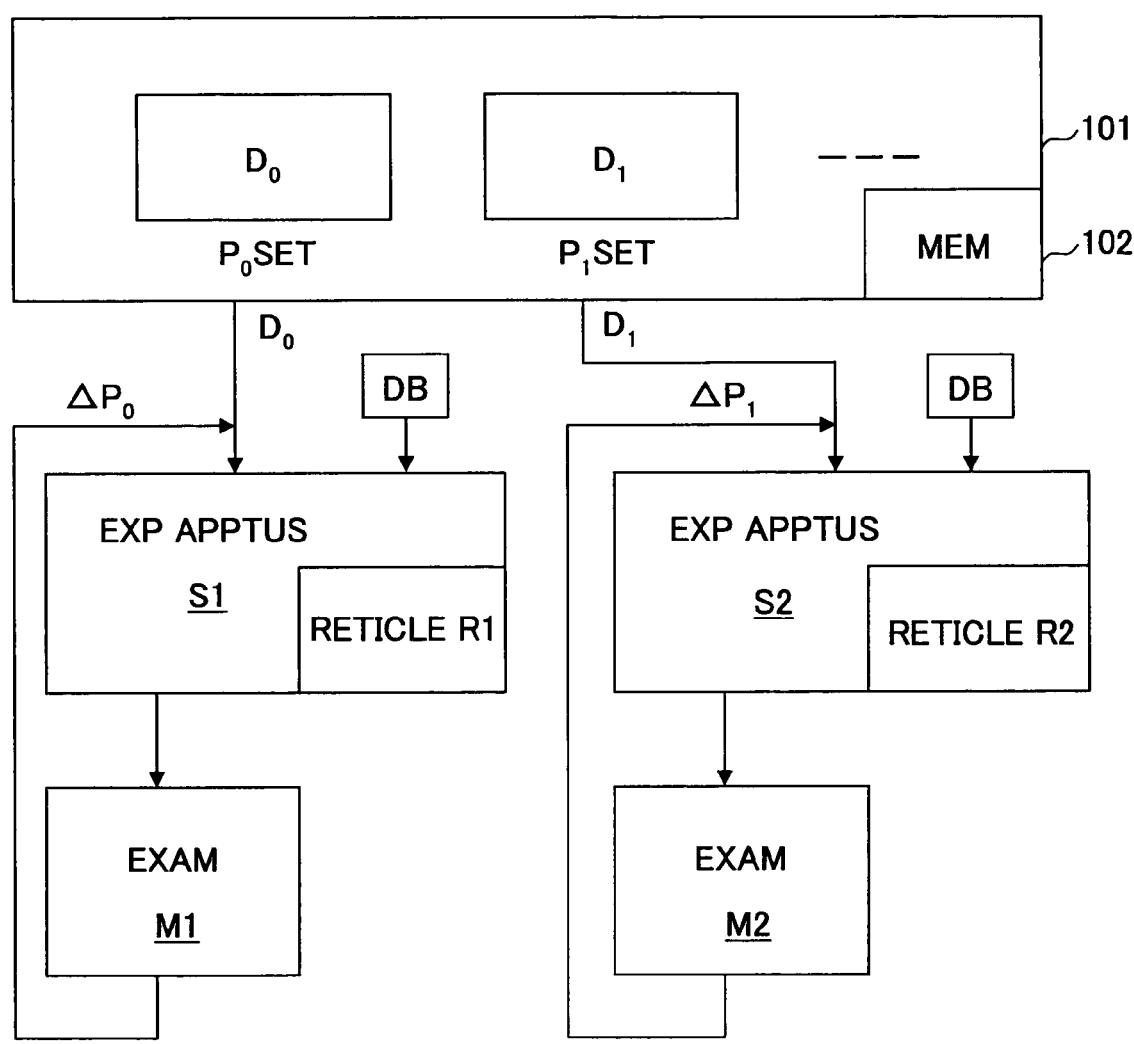
FIG. 11 is a diagram showing the construction of an exposure system according to the second embodiment of the present invention.

Thus, in the present embodiment, there are provided databases DB to the exposure apparatuses S1 and S2 as shown in FIG. 11 and the trend of the variation of the state of the respective exposure apparatuses are stored in the respective databases in the form of the date and time in which the change of the state has occurred together with the amount of the change. Thereby, the corrected alignment error correction parameter Estimate (ChipMagX,Y, $L_j$) is obtained by reading out the state E0(t) and E1(t) of the exposure apparatuses S1 and S2 from the database at the time of the exposure process.

FIG. 11, it should be noted that those parts explained previously with reference to FIG. 5 are designated by the same reference numerals and the description thereof will be omitted.

Here, it should be noted that the variation trend of the state of the exposure apparatus held in the database DB is not limited to the one related to the fabrication and production of a specific semiconductor device such as the one explained with reference to FIGS. 1A and 1B, but it is also possible to include the trend data at the time of fabricating other various semiconductor devices into the trend data held in the database.

Further, while the relationship of Equation (5) is defined for the current lot #j and the just-before lot #j-1, it is also possible to define the quantity Estimate(ChipMagX,Y, Lj) between the current lot #j and the past lot #j-i (i=1, 2, 3, . . . ) and use the value of the quantity Estimate (ChipMagX,Y, $L_j$) obtained by a simple average or weighted average of these.

Further, the present invention is not limited to the embodiments described heretofore, but various variations and modifications may be made without departing from the scope of the invention.

What is claimed is:

1. A method of fabricating a semiconductor device that includes an exposing process in which a lower pattern is formed by a first exposing process and an upper pattern is formed thereon by a second exposing process, said exposing process comprising:

an earlier exposure step of aligning and exposing, in a just-before lot conducted immediately before a current lot, an upper pattern on a substrate of said just-before lot, on which a lower pattern is formed by said first exposing process, by conducting said second exposing process such that said upper pattern is in alignment with said lower pattern; and a latter exposure step of aligning and exposing, in said current lot, an upper pattern on a substrate of said current lot, on which a lower pattern is formed by said first exposing process, by conducting said second exposing process such that said upper pattern is in alignment with said lower pattern on said substrate of said current lot, said exposure process further comprising the steps of:

obtaining a first correction value representing a difference of first and second alignment error correction parameter preset values respectively used at the time of said first exposing process of exposing said lower patterns in said current lot and in said just-before lot;

obtaining, as a second correction value, an optimum correction amount of a third alignment error correction parameter preset value, which has been needed for proper alignment of said upper pattern in said second exposing process of said just-before lot, said third alignment error correction parameter has been used in said second exposing process of said just-before lot for exposing said upper pattern;

obtaining an optimum correction parameter prediction value to be used for exposing said upper pattern in said second exposing process of said current lot, from said first correction value and said second correction value; and exposing said upper pattern of said current lot in said latter exposure step while using said optimum parameter prediction value.

2. The method as claimed in claim 1, wherein said second correction value is obtained from an actual measurement of alignment marks included in said upper pattern and said lower pattern formed in said just-before lot.

3. The method as claimed in claim 1, wherein said optimum correction parameter prediction value is obtained for one or more of said alignment error correction parameters.

4. The method as claimed in claim 1, wherein said optimum correction parameter prediction value is obtained for all of said alignment error correction parameters.

5. The method as claimed in claim 1, wherein said first exposing process is carried out by a first exposure apparatus and said second exposing process is carried out by a second exposure apparatus.

6. The method as claimed in claim 1, further comprising the steps of:

correcting said first correction amount with a first variation amount corresponding to a variation of state of said first exposure apparatus occurred between said just-before lot and said current lot; and correcting said second correction amount with a second variation amount corresponding to a variation of state of said second exposure apparatus occurred between said just-before lot and said current lot.

7. The method as claimed in claim 6, wherein said variation amount is obtained by reading a first database storing therein a state variation trend of said first exposure apparatus, said variation amount is obtained by reading a second database storing therein a state variation trend of said second exposure apparatus.

8. The method as claimed in claim 7, wherein said state variation trend of said first exposure apparatus stored in said first database includes information about the state of said first exposure apparatus for the case of exposing a plurality of semiconductor devices of different kinds conducted by using said first exposure apparatus, said state variation trend of said second exposure apparatus stored in said second database includes information about the state of said second exposure apparatus for the case of exposing a plurality of semiconductor devices of different kinds conducted by using said second exposure apparatus.

9. The method as claimed in claim 7, wherein said state variation trend of said first exposure apparatus stored in said first database includes information about the state of said first exposure apparatus for the case of exposing semiconductor devices of a single kind conducted by using said first exposure apparatus, said state variation trend of said second exposure apparatus stored in said second database includes information about the state of said second exposure apparatus for the case of exposing semiconductor devices of a single kind conducted by using said second exposure apparatus.

10. A method of fabricating a semiconductor device that includes an exposing process in which a lower pattern is formed by a first exposing process and an upper pattern is formed thereon by a second exposing process, said exposing process comprising:

an earlier exposure step of aligning and exposing, in a just-before lot conducted immediately before a current lot, an upper pattern on a substrate of said just-before lot, on which a lower pattern is formed by said first exposing process, by conducting said second exposing process such that said upper pattern is in alignment with said lower pattern; and a latter exposure step of aligning and exposing, in said current lot, an upper pattern on a substrate of said current lot, on which a lower pattern is formed by said first exposing process, by conducting said second exposing process such that said upper pattern is in alignment with said lower pattern on said substrate of said current lot, said exposure process further comprising the steps of:

obtaining first and second alignment error correction parameter preset values used respectively for alignment of said lower patterns at the time of said first exposing process of exposing said lower pattern respectively in said current lot and said just-before lot;

obtaining an optimum correction amount needed for correcting an alignment error correction parameter preset value used in said second exposing process of said earlier exposure step for exposing said upper pattern in said just-before lot with proper alignment;

obtaining an optimum correction parameter preset value used in said second exposing process of said latter exposure step for exposing said upper pattern of said current lot, from said first alignment error correction parameter preset value, said second alignment error correction parameter preset value and said optimum correction amount; and exposing said upper pattern of said current lot in said second exposing process of said latter exposure step, while using said optimum correction parameter preset value.

11. The method as claimed in claim 10, further comprising the steps of: correcting said optimum correction parameter preset value with an amount corresponding to a state variation of an exposure apparatus used for said earlier exposure step caused between said just-before lot and said current lot; and further correcting said optimum correction parameter preset value with an amount corresponding to a state variation of an exposure apparatus used for said latter exposure step caused between said just-before lot and said current lot.

* * * * *